United States Patent
Groothuis

(10) Patent No.: US 6,192,709 B1
(45) Date of Patent: Feb. 27, 2001

(54) QUENCHER CLAMPING OPERATION USING AN ELECTROMAGNET

(75) Inventor: Steven K. Groothuis, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/239,189

(22) Filed: Jan. 28, 1999

Related U.S. Application Data

(62) Division of application No. 08/810,956, filed on Feb. 27, 1997, now Pat. No. 5,950,069.

(51) Int. Cl.$^7$ ................................................ C03C 27/02
(52) U.S. Cl. .................... 65/59.1; 65/59.24; 65/59.26; 65/59.7; 65/152; 65/154; 65/155; 65/DIG. 11; 65/DIG. 12; 438/106; 438/121; 438/123
(58) Field of Search .................... 65/59.1, 59.24, 65/59.26, 59.7, 154, 152, 155, DIG. 11, DIG. 12; 438/106, 121, 123

(56) References Cited

U.S. PATENT DOCUMENTS

| | | |
|---|---|---|
| 3,349,352 | * 10/1967 | Zandt . |
| 3,487,271 | * 12/1969 | Laffert, Jr. . |
| 3,909,210 | * 9/1975 | Huttner . |
| 4,157,611 | * 6/1979 | Ohwaki et al. . |
| 5,076,204 | * 12/1991 | Hisamune . |
| 5,950,069 | * 9/1999 | Groothuis . |

* cited by examiner

Primary Examiner—Stanley S. Silverman
Assistant Examiner—Michael P. Colaianni
(74) Attorney, Agent, or Firm—Wade James Brady, III; Frederick J. Telecky, Jr.

(57) ABSTRACT

A method of embedding a magnetically attractable member (25) in a ceramic material (1) and a system therefor wherein there are provided a magnetically attractable member and a ceramic member capable of being placed in a molten state. The magnetically attractable member is disposed over the ceramic member and the ceramic member is placed in a molten state. The magnetically attractable member is then disposed in the molten ceramic member by magnetic attraction and the molten ceramic member is then hardened around the magnetically attractable member. The magnetically attractable member is taken from the class consisting of Alloy 42 and Kovar. The ceramic member is preferably a glass. The ceramic member is preferably disposed on a semiconductor package and the magnetically attractable member is preferably at least a portion of a semiconductor lead frame.

8 Claims, 1 Drawing Sheet

QUENCHER CLAMPING OPERATION USING AN ELECTROMAGNET

This application is a divisional of prior application Ser. No. 08/810,956 filed Feb. 27, 1997. Now U.S. Pat. No. 5,950,069.

BACKGROUND OF THE INVENTION

1. Field of the Invention

This invention relates to a ceramic packaging assembly process and, more specifically, to a method of embedding a metallic lead frame into molten glass.

2. Brief Description of the Prior Art

In the fabrication of semiconductor devices, an often required step is that of embedding metallic members, generally wires and/or the lead fingers of a lead frame, into a reflowed molten glass and permitting the glass to harden around the metallic member. This fabrication step generally requires that a large mechanical pressure be applied to the metallic members which are disposed over the molten glass, generally by an unheated or heated thermode or the like. The thermode or the like drives the lead fingers into the molten glass and applies the force until the glass hardens, whereupon the thermode or the like is withdrawn. This pressure results in residual overstressing of the glass-enclosed metal with resultant cracking of the glass.

SUMMARY OF THE INVENTION

In accordance with the present invention, the above described problems of the prior art are overcome and there is provided a method and system for embedding magnetically attractable metal in glass without the presence of the cracking problem.

Briefly, a conventional electromagnet magnetically pulls the metallic member, such as a wire, lead frame or lead frame finger, which is now formed of a magnetically attractable material, into the molten glass and retains the metal in the glass until the glass has hardened. The magnetically attractable material can be, for example, Alloy 42 (iron-nickel alloy commonly used in integrated circuit packaging) and Kovar (an iron-nickel alloy). Since there are no physical forces exerted on the glass, the probability of fracture of the brittle glass is materially reduced.

DESCRIPTION OF THE PREFERRED EMBODIMENT

Figure 1:
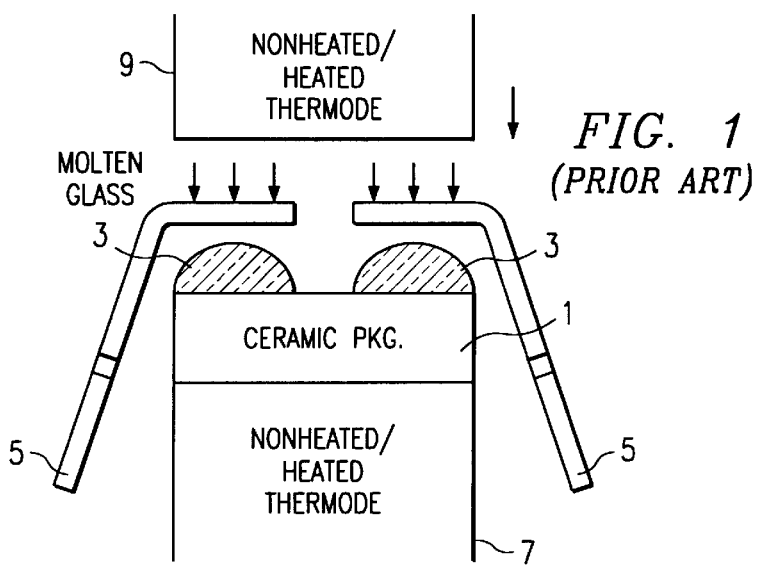
FIG. 1 is a schematic diagram of a prior art procedure for embedding a metallic member in glass and equipment therefor.

Referring first to FIG. 1, there is shown a prior art procedure for embedding a metallic member in glass and equipment therefor. A base member, shown as a semiconductor ceramic package 1, is disposed over a heated or unheated thermode 7. The amount of heat generated by the thermode 7 is maintained sufficiently low so as not to damage the contents of the package 1. Regions of glass 3 are disposed on the surface of the package 1 and metallic members 5, such as, for example, the metallic fingers of a semiconductor lead frame, are disposed over the regions of glass 3. The regions of glass 3 are made molten through high temperature melting at ~400° C.±25° C. either prior to or after disposing the metallic members 5 thereover. A thermode 9, which can be heated or unheated, is then lowered against the metallic members 5 and drives the metallic members into the regions of glass 3. The glass is allowed to cool and harden around the metallic members 5 and the thermode 9 is then withdrawn. As an alternative, the thermode 9 can provide sufficient heat to melt the glass 3 after contacting the metallic members 5 rather than heating the glass by an external source.

Figure 2:
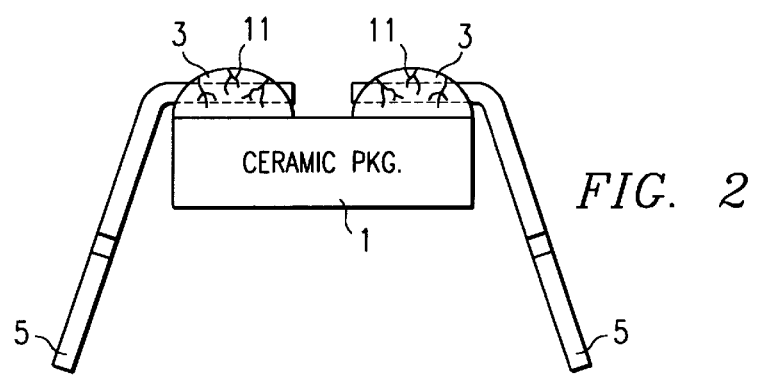
FIG. 2 is a cross sectional view of a ceramic package with metallic members embedded in glass in accordance with the prior art.

With reference to FIG. 2, it is seen that the pressure applied to the metal-imbedded glass 3 by the thermode 9 after glass hardening causes cracks 11 in the regions of glass surrounding the metal members 5.

Figure 3:
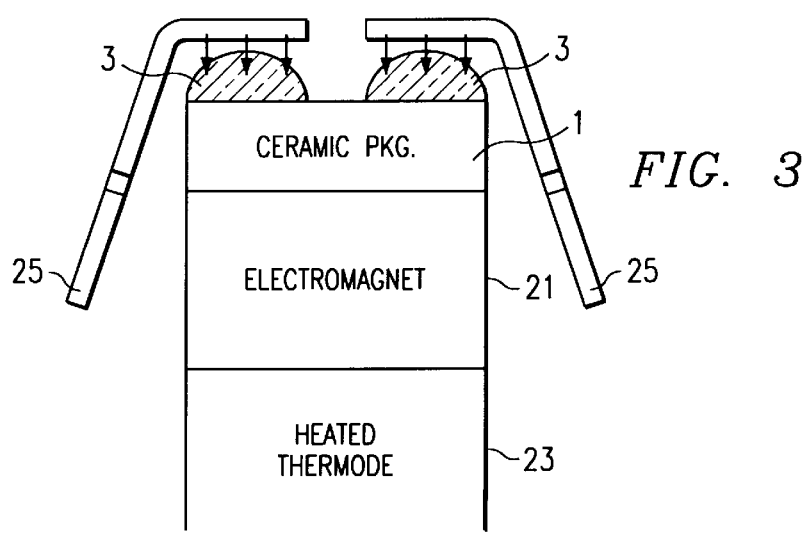
FIG. 3 is schematic diagram of a procedure for embedding a metallic member in glass in accordance with the present invention and equipment therefor.

Referring now to FIG. 3, there is shown a procedure in accordance with the present invention for embedding a metallic member in glass and the equipment therefor. The same ceramic package 1 has the same glass 3 thereover as in FIGS. 1 and 2. However the thermode 7 is replaced by an electromagnet 21 which is disposed over a thermode 23, preferably heated to a temperature in the range of from about 375° C. to about 425° C. with preferred temperature being based upon the material and its melting kinetics and below the package 1. The thermode 9 is eliminated. The metallic members 25 are formed of a magnetically attractable material, preferably Alloy 42 or Kovar.

In operation, the glass regions 3 are melted by high temperature melting at 400° C., either before or after disposition of the metallic members 25 thereover and preferably after such disposition. While the glass regions 3 are in the molten state, the electromagnet 21 is energized, thereby attracting the metallic members 25 thereto and into the glass regions. With the electromagnet still operational, the glass regions 3 are allowed to cool so that the glass hardens around the metallic members 25. The electromagnet is then turned off. It is apparent that no large physical force is ever applied to the glass during the above described procedure, thereby minimizing cracking of the glass and completely eliminating such cracking due to mechanical overstressing.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A system for embedding a magnetically attractable member in a ceramic member comprising:
    (a) a ceramic member capable of being placed in a molten state and having a pair of opposing sides;
    (b) a magnetically attractable member disposed adjacent one of said sides of said ceramic member;
    (c) a controllable source of magnetic flux disposed adjacent the other of said pair of opposing sides of said ceramic member for magnetically attracting said magnetically attractable member into said ceramic member when said ceramic member is in the molten state; and
    (d) means to selectively alter the physical state of said ceramic member into said molten state while said magnetically attractable member is attracted into said ceramic member.

2. The system of claim 1 wherein said magnetically attractable member is metallic.

3. The system of claim 1 wherein said magnetically attractable member is selected from the group consisting of Alloy 42 and Kovar.

4. The system of claim 1 wherein said ceramic member is a glass.

5. The system of claim 2 wherein said ceramic member is a glass.

6. The system of claim 3 wherein said ceramic member is a glass.

7. The system of claim 1 wherein said controllable source of magnetic flux is an electromagnet.

8. The system of claim 6 wherein said controllable source of magnetic flux is an electromagnet.

* * * * *